United States Patent [19]

Sarma

[11] Patent Number: 5,110,748
[45] Date of Patent: May 5, 1992

[54] METHOD FOR FABRICATING HIGH MOBILITY THIN FILM TRANSISTORS AS INTEGRATED DRIVERS FOR ACTIVE MATRIX DISPLAY

[75] Inventor: Kalluri R. Sarma, Mesa, Ariz.

[73] Assignee: Honeywell Inc., Minneapolis, Minn.

[21] Appl. No.: 733,922

[22] Filed: Jul. 22, 1991

Related U.S. Application Data

[62] Division of Ser. No. 676,998, Mar. 28, 1991.

[51] Int. Cl.$^5$ ............................................. H01L 21/70
[52] U.S. Cl. ......................................... 437/51; 437/59; 437/62; 437/86; 437/974; 148/DIG. 12; 148/DIG. 150
[58] Field of Search ............... 437/84, 51, 59, 61, 437/62, 974, 86; 148/DIG.12, DIG. 150

[56] References Cited

U.S. PATENT DOCUMENTS

| | | | |
|---|---|---|---|
| 3,959,045 | 5/1976 | Antypas | 437/86 |
| 3,997,381 | 12/1976 | Waniass | 148/DIG. 12 |
| 4,292,730 | 10/1981 | Ports | 437/86 |
| 4,888,304 | 12/1989 | Nakagawa et al. | 148/DIG. 12 |
| 4,891,329 | 1/1990 | Reisman et al. | 148/DIG. 12 |
| 4,983,251 | 1/1991 | Haisma et al. | 148/DIG. 12 |
| 5,006,487 | 4/1991 | Stokes | 437/974 |
| 5,013,681 | 5/1991 | Godbey et al. | 437/62 |

FOREIGN PATENT DOCUMENTS 2206445  1/1989  United Kingdom ....... 148/DIG. 12

*Primary Examiner*—Brian E. Hearn
*Assistant Examiner*—Michael Trinh
*Attorney, Agent, or Firm*—John G. Shudy, Jr.

[57] ABSTRACT

High mobility thin film transistors for fabricating integrated drivers for active matrix displays and a special method of fabrication for obtaining the thin film transistors having mobility sufficiently high enough as drivers operable in the several megahertz frequency range needed for driving high resolution active matrix displays.

3 Claims, 14 Drawing Sheets

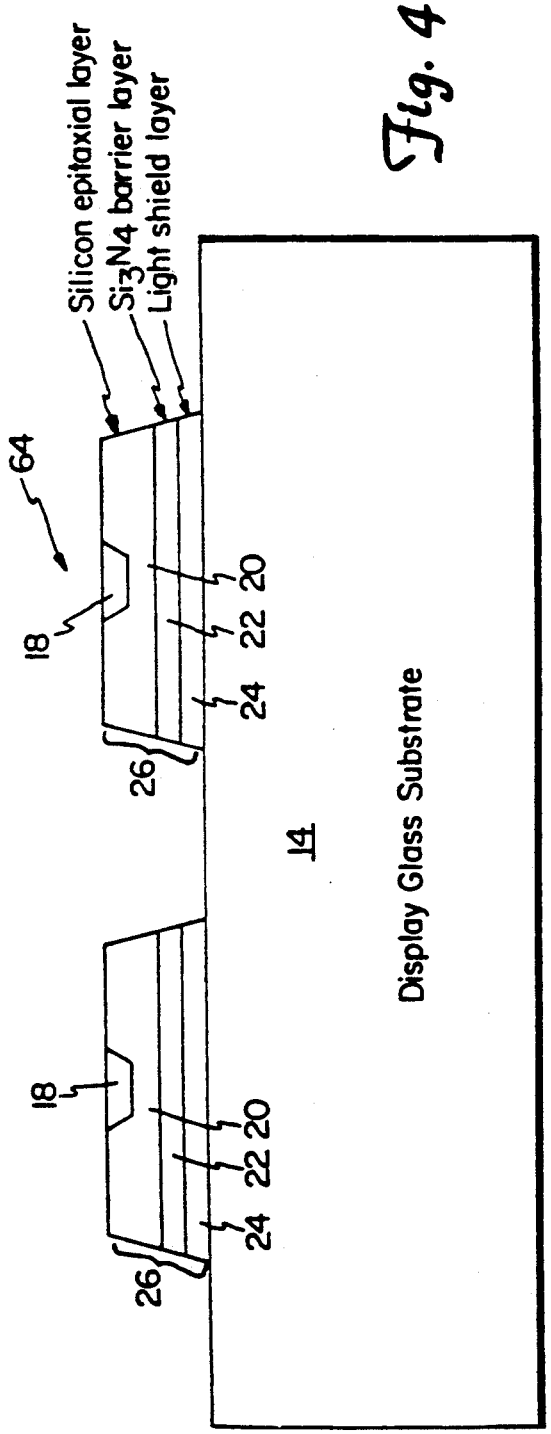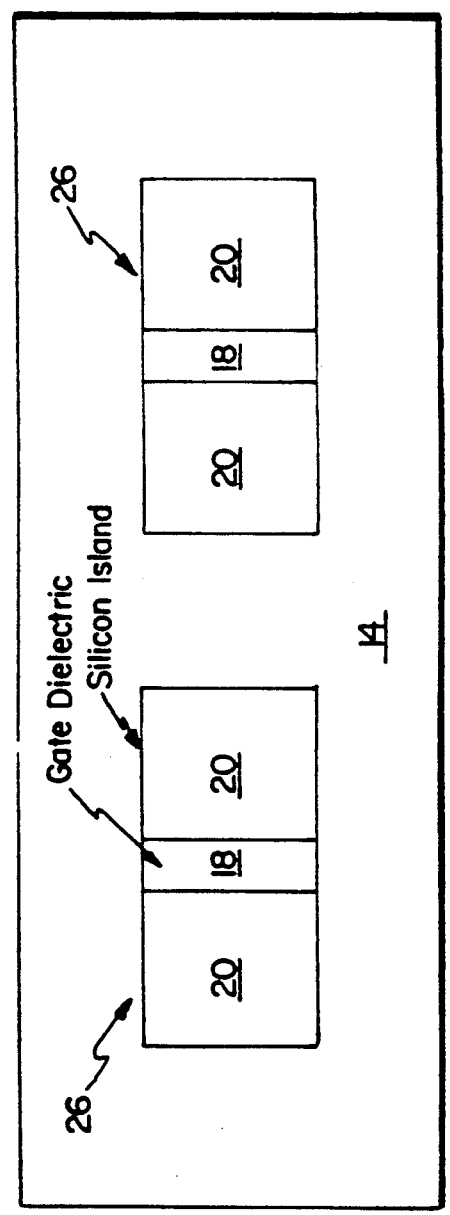

METHOD FOR FABRICATING HIGH MOBILITY THIN FILM TRANSISTORS AS INTEGRATED DRIVERS FOR ACTIVE MATRIX DISPLAY

This application is a division of application Ser. No. 07/676,998, filed Mar. 28, 1991.

FIELD OF THE INVENTION

The invention pertains to active matrix displays, and particularly pertains to integrated drivers for active matrix displays. More particularly, the invention pertains to high mobility thin film transistors for fabricating integrated drivers for active matrix displays.

BACKGROUND OF THE INVENTION

Flat panel displays show a significant potential for reducing the weight, volume, power consumption, and cost, as well as providing enhanced reliability compared to the conventional cathode ray tube (CRT) displays. These displays are being developed as a replacement for CRT displays in several select applications such as for computer, entertainment, military and avionic displays. The display technologies, namely plasma, thin film electroluminescence (TFEL), and active matrix liquid crystal displays (AMLCD), which are being actively developed to realize this potential, share the common features of matrix addressing and the associated driver interconnect problems. Presently, the row and column drivers are fabricated using bulk single crystal silicon. The driver chips are interconnected to the display glass using either the flex cable, or chip-on-glass approach. Both approaches limit the achievable display resolution due to minimum interconnect pitch required, consume significant peripheral space, and present reliability issues due to the thousands of interconnects between the glass and driver chips.

By fabricating drivers on glass (integrated drivers), the above problems can be alleviated. Integrated drivers drastically reduce the number of interconnects from several thousand to around 10, allow higher resolution, redundancy, and greater flexibility in display system packaging, and improve display reliability. Unfortunately, the present amorphous silicon (a-Si) and polysilicon (poly-Si) thin film transistor (TFT) technologies do not allow fabrication of high resolution integrated drivers due to their low mobility. A-Si has mobility in the range of 0.1–1.0 centimeter$^2$/volt*second (Cm$^2$/V.S.), which is too low for fabricating integrated display drivers. Poly-Si has a mobility in the range of 10–50 Cm$^2$/V. Sec. and has been used to fabricate integrated drivers for moderate resolution displays such as 480 H × 440 V pixels. However, for higher resolutions such as 1024 H × 1024 V, use of poly-Si TFTs requires a complex series/parallel driver architecture, without a dramatic reductions in the number of interconnects required.

High resolution active matrix displays require drivers capable of being operated in the several megahertz frequency range. Such performance requires a semiconductor with a field effect mobility in excess of 300 centimeter$^2$/volt.second. Only single crystal silicon is known to satisfy this requirement. Single crystal silicon allows simpler driver architecture and dramatically reduces the number of interconnects needed. However, it has not been possible to deposit single crystal silicon films on display glass substrates. Depending on the substrate temperature, such depositing of silicon films results in films that are either amorphous or polycrystalline, and have lower mobility. Yet, single crystal silicon films can be deposited on sapphire substrates, i.e., silicon on sapphire (SOS) technology, which are transparent. Although SOS transistors have high mobility, their leakage currents are unacceptably high for active matrix display application. Other disadvantages are that large area sapphire substrates are not readily available and they are expensive.

Electrostatic bonding of a single crystal silicon wafer to a glass substrate and thinning (preferential etching) of the silicon wafer have been used by others for producing high mobility single crystal silicon films on glass substrates. Others have utilized CORNING Code 1729 glass substrates in their experiments. The 1729 substrate is a high temperature (i.e., strain point = 850° Celsius (C) glass. The glass has been produced by Corning Corp. in a small rod form and sliced into wafers in experimental quantities. This 1729 glass is difficult to produce with large areas for practical applications due to its high temperature. The most commonly available display glass substrates for practical applications are CORNING Code 7059, CORNING Code 1733, HOYA NA40, and ASAHI NA. The upper useable temperature limit of these display glass substrates is about 640° C. The difficulty is that such temperature is not adequate for forming a high quality thermal silicon dioxide gate dielectric utilized in the conventional MOS processing for display driver circuits or chips. Transistors fabricated with deposited silicon dioxide gate dielectric at temperatures less than 700° C., generally have higher threshold voltages and/or threshold voltage instabilities due to defects in such deposited dielectric. Additionally, these thin film transistors (TFT), when used as active matrix switches, require light shields at the top and bottom to maintain low leakage currents (i.e., off-currents), while operating under high ambient light conditions. However, in view of the conventional electrostatic bonding and preferential thinning approach it is not possible to light shield the bottom side of the TFT because the back interface of the substrate is not accessible after electrostatic bonding. There is a great need for a process of fabricating high mobility TFTs and integrated drivers, which circumvents the above-mentioned problems. The present invention is a process which solves those problems.

SUMMARY OF THE INVENTION

The present invention is a method for fabricating high mobility TFTs and display drivers integrated on the active matrix substrate. Besides resulting in the single crystal silicon for high field effect mobility, there is a thermal silicon dioxide gate dielectric for a low and stable threshold voltage, and light shields for low off-currents under high ambient lighting conditions. Thus, a high resolution active matrix display with integrated display drivers operable in the multi-megahertz frequency range, is achievable with the present invention.

BRIEF DESCRIPTION OF THE DRAWINGS

FIG. 4 is a cross-sectional view after the silicon islands, along with the gate dielectric, have been etched.

FIG. 5 is a plan-view of the silicon islands with the gate dielectric.

DESCRIPTION OF THE PREFERRED EMBODIMENT

Figure 1:
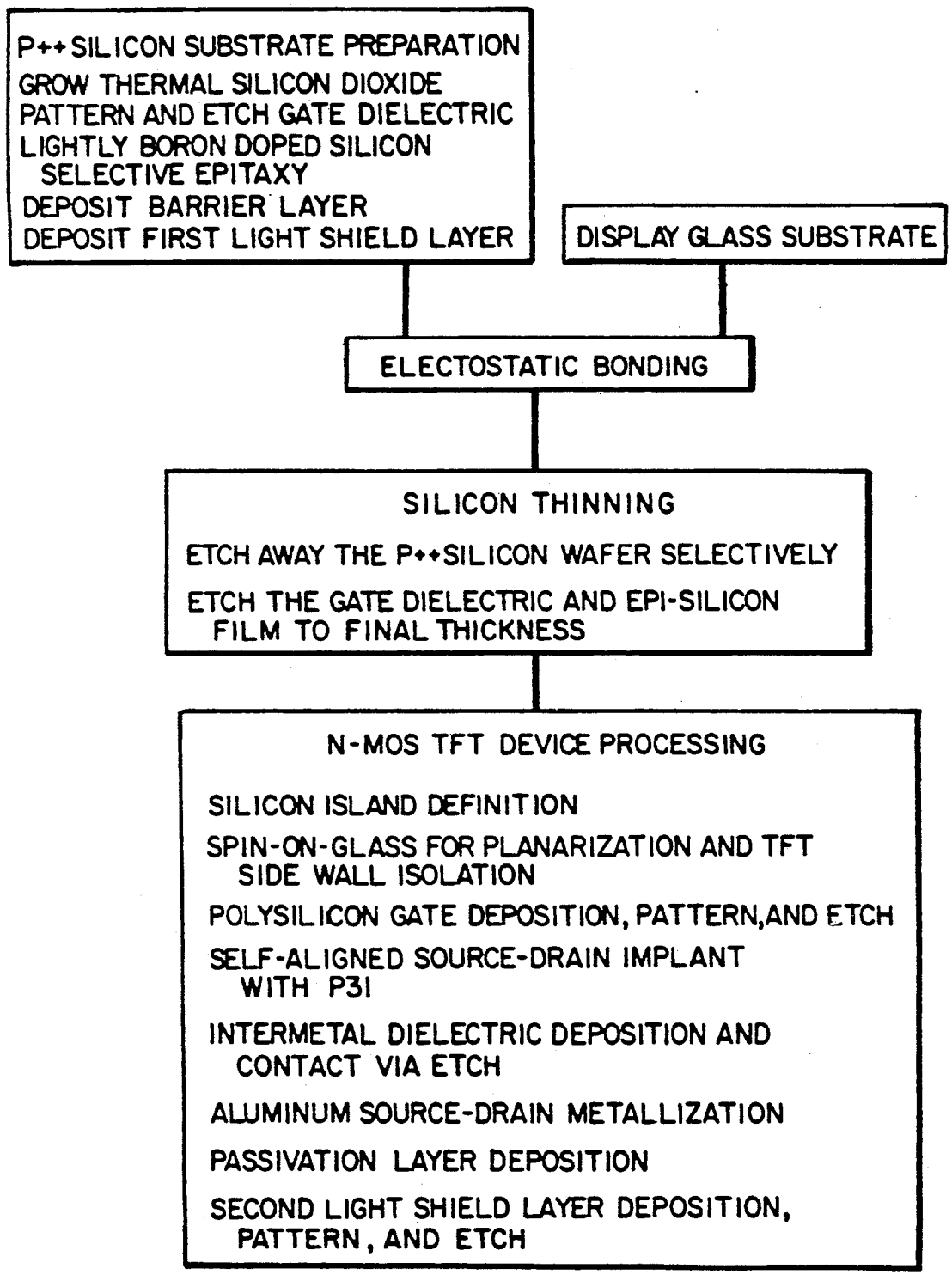
FIG. 1 is a method flow diagram for fabricating high mobility TFTs and an active matrix substrate having integrated drivers.

FIG. 1 shows the process flow for fabrication of high mobility n-channel TFTs. The process steps are described in conjunction with the ensuing figures.

Figure 2:
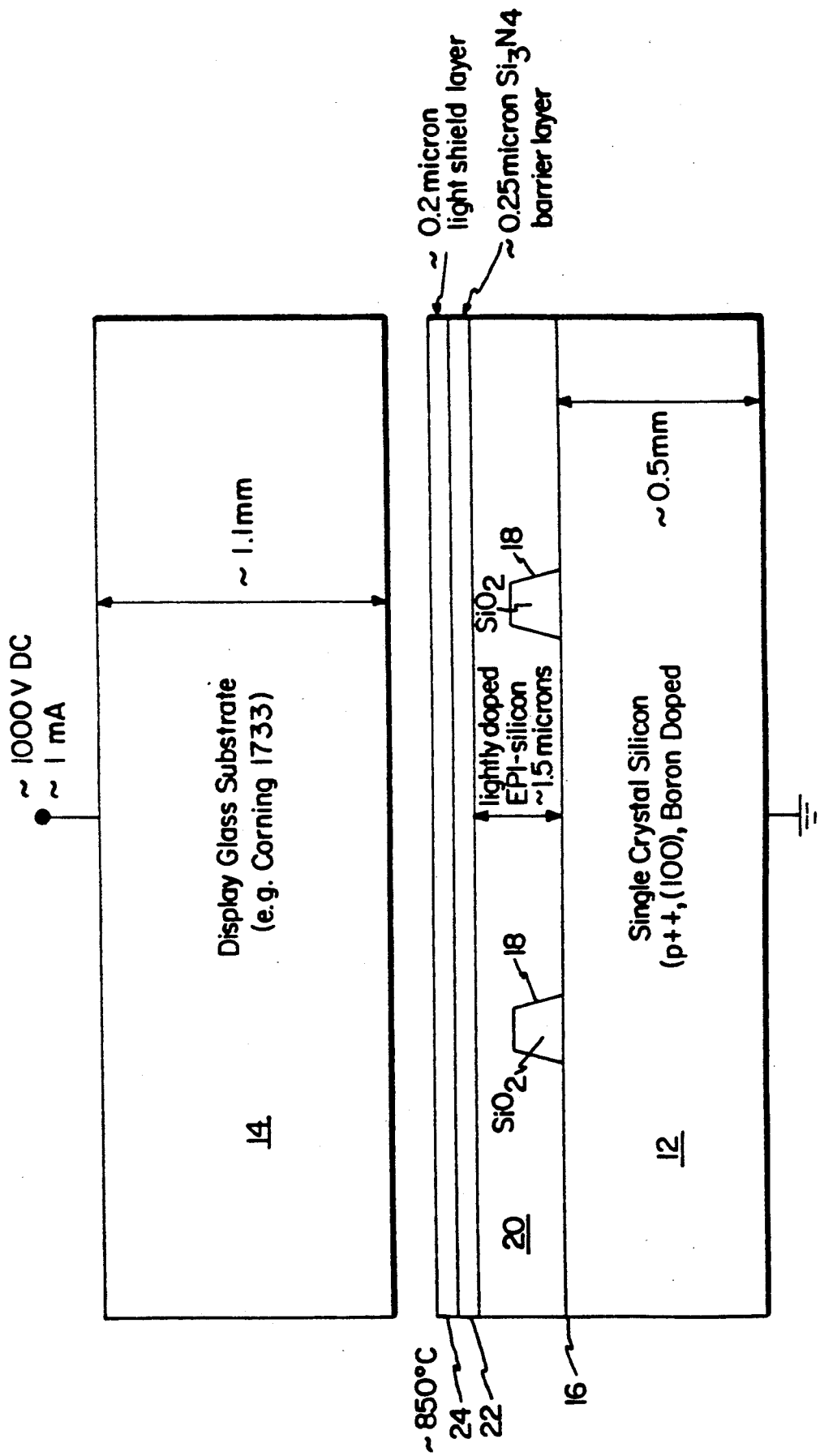
FIG. 2 is a cross-sectional view of a display glass substrate and a single crystal silicon wafer prepared for bonding.

FIG. 2 reveals a silicon substrate 12 and display glass substrate 14 prior to electrostatic bonding. Single crystal silicon substrate 12 is P-type has a boron concentration greater than $8 \times 10^{18}$ atoms/Cm$^3$, a (100) orientation, ($p^{++}$) and a thickness of approximately 0.5 millimeters. Silicon substrate 12 is initially thermally oxidized in dry oxygen to produce about 0.5 micron of high quality silicon dioxide on surface 16. The thermal silicon dioxide is then patterned and etched to produce gate dielectric regions 18 for the TFTs to be fabricated. The pattern on the oxide also includes alignment keys for registration of the subsequent layers to gate dielectric regions 18. Next, approximately 1.5 microns of lightly doped epitaxial (epi) silicon 20 is grown on top of silicon wafer 12 containing oxide islands 18. Because an SiO$_2$ layer presents a difficult nucleation surface for silicon chemical vapor deposition (CVD), lateral epitaxy results on top of oxide islands 18. Thus, a uniform epitaxial layer 20 of lightly boron doped, high mobility silicon of about a 1.5 micron thickness is produced by a selective epitaxial process. On top of layer 20, a Si$_3$N$_4$ barrier layer 22 is deposited with a thickness of about 0.25 micron via plasma CVD. Barrier layer 22 serves as an isolation layer. Silicon dioxide deposited by plasma CVD may also be used as a barrier layer. On layer 22, a light shield layer 24 of about 0.2 micron is deposited. After deposition of layer 24, silicon wafer 12 is then ready for bonding. Light shield layer 24 may be composed of refractory metal or similar substance, which is compatible with the electrostatic bonding process and barrier layer 22. Silicon wafer 12 incorporating layers 20, 22 and 24, is then electrostatically bonded to display glass substrate 14 at light shield 24 surface of wafer 12. Provision for electrical contact to light shield layer 24 for electrostatic bonding may be made by any one of various means. For example, silicon wafer 12 can be made larger than glass substrate 14 to have access to light shield layer 14, for electrical contact during bonding. Display glass substrate 14 may be CORNING Code 1733 or other like material. Substrate 14 is approximately 1.1 millimeters thick. Electrostatic bonding involves applying approximately 1000 volts direct current across the display glass substrate 14 and wafer 12 for a bonding between layers 14 and 24 at a temperature of about 600° C.

Figure 3:
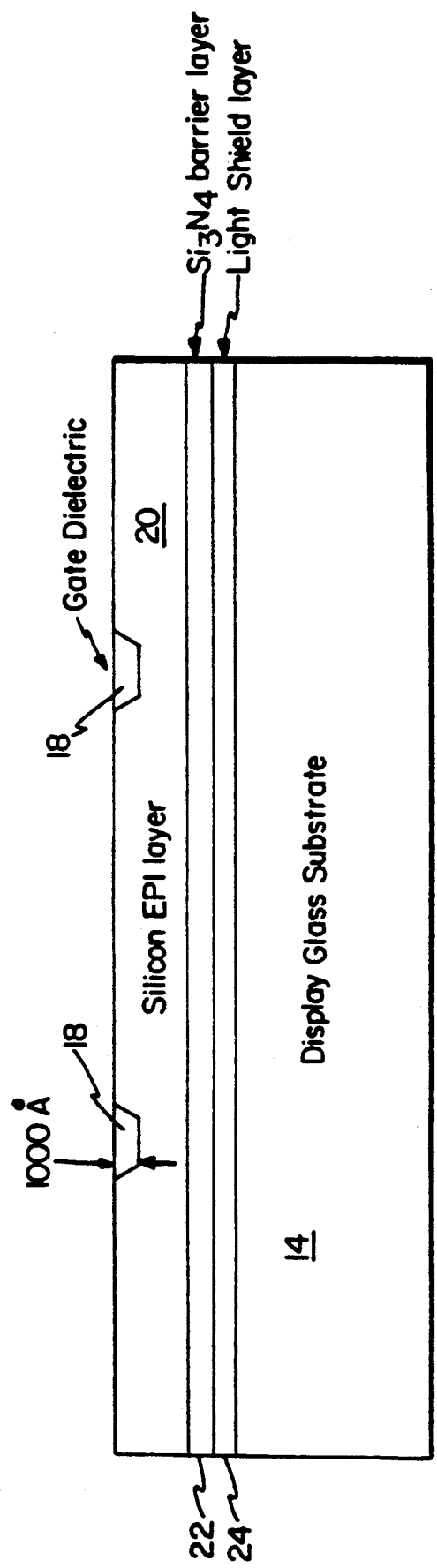
FIG. 3 is a cross-sectional view of the display glass substrate after the bonding and thinning of the single crystal silicon.

After the bonding of layers 14 and 24, $p^{++}$ silicon substrate 12 is etched off starting from the surface opposite of surface 16, down past surface 16 on into layer 20, including some of islands 18 to a level wherein a portion of thickness of islands 18 is remaining. This etching is accomplished with the use of impurity selective etch 8HAc:3HNO3:1HF. Impurity selective etch preferentially etches the $p^{++}$ silicon layer 12 one hundred times faster than the lightly doped epi-silicon layer 20. This permits a controllable etch removal of $p^{++}$ substrate 12. Alternatively, a majority of the silicon wafer 12 may be removed by mechanical grinding and lapping prior to impurity selective preferential etching, for the remainder of wafer 12. A portion of epi layer 20 and thermal oxide islands 18 are controllably etched to achieve about 1,000 angstroms of gate dielectric 18 as shown in FIG. 3. This etching can be done using wet chemical etching or plasma etching.

Silicon epi layer 20, barrier layer 22 and light shield 24 are patterned and etched to form islands 26 for the fabrication of TFTs for the active matrix array and display drivers, as shown in FIGS. 4 and 5.

Figure 6:
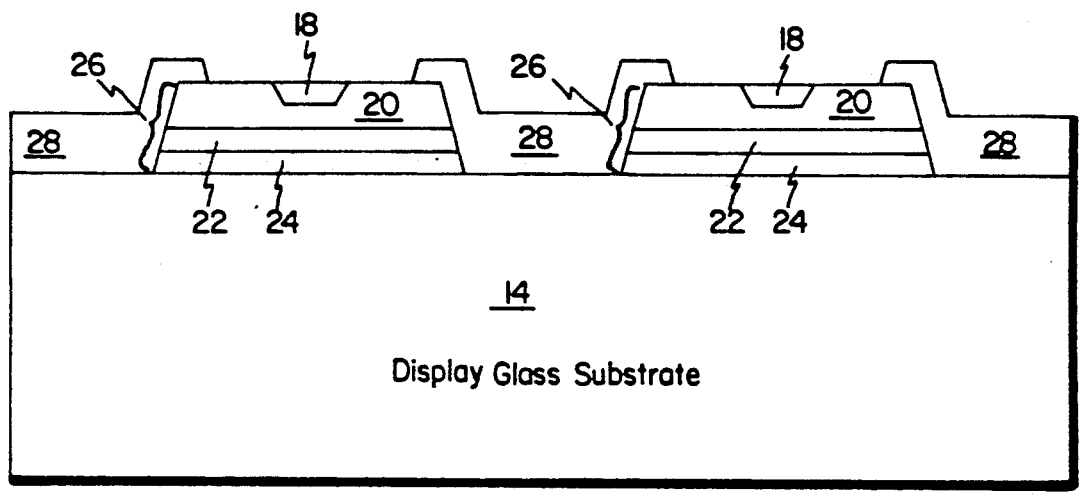
FIG. 6 is a cross-sectional view of the substrate having a spin-on-glass planarization layer.
Figure 7:
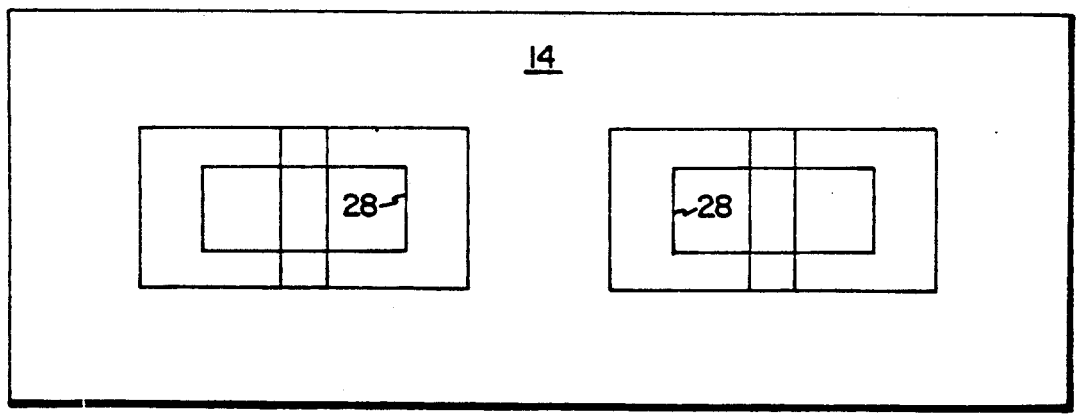
FIG. 7 is a plan-view of the substrate with the spin-on-glass layer.

Spin-on-glass 28 (e.g., Allied Chemical ACCU-GLASS XA03-5) is applied on substrate 14 and islands 26, and is patterned and etched as shown in FIGS. 6 and 7. Spin-on-glass 28 protects the subsequent gate 30 from shorting to the TFT channel. Also, spin-on-glass 28 planarizes the surface.

Figure 8:
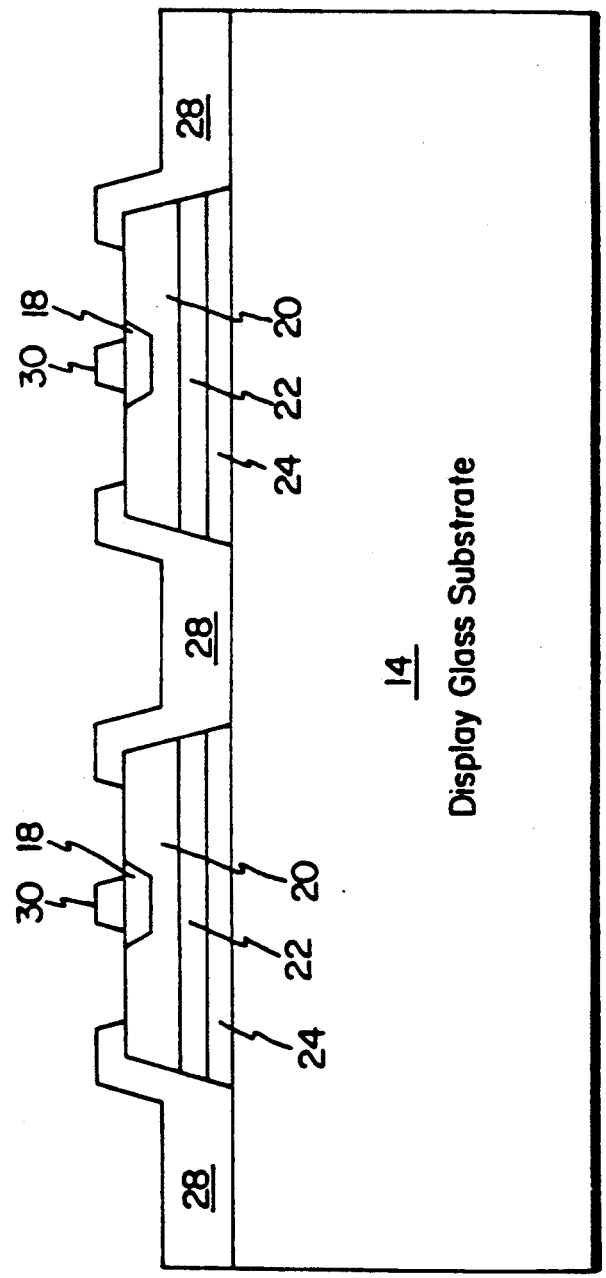
FIG. 8 shows a deposition pattern and etch for a polysilicon gate.
Figure 9:
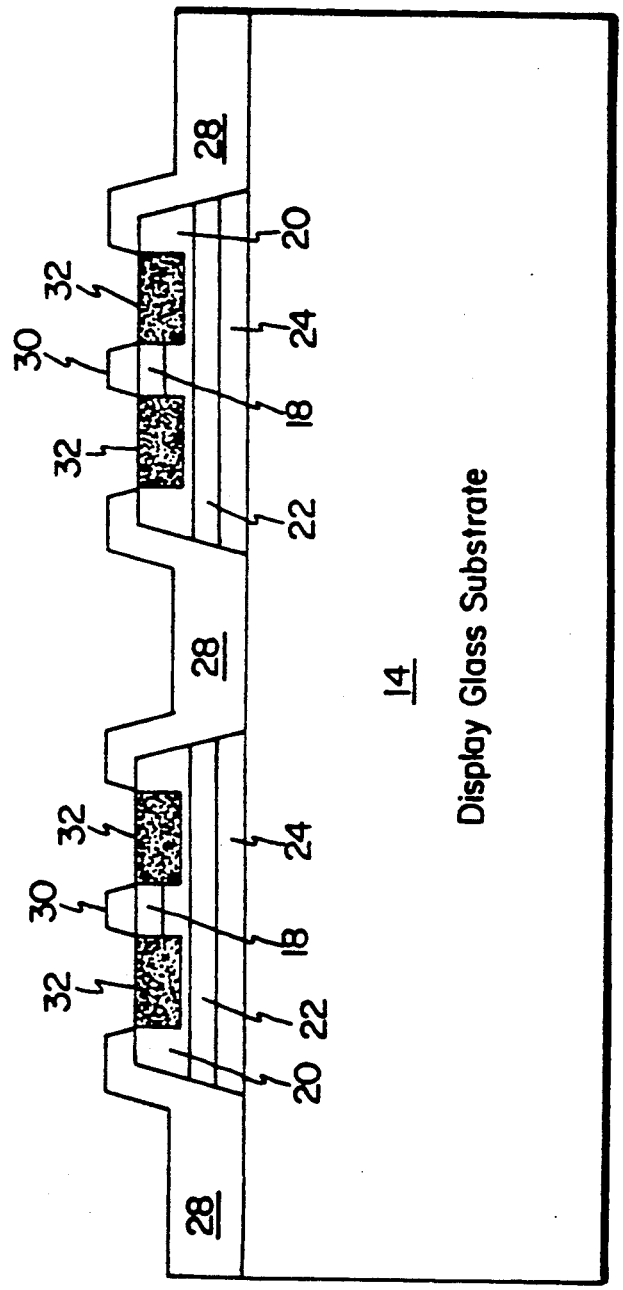
FIG. 9 reveals the source-drain implants.
Figure 10:
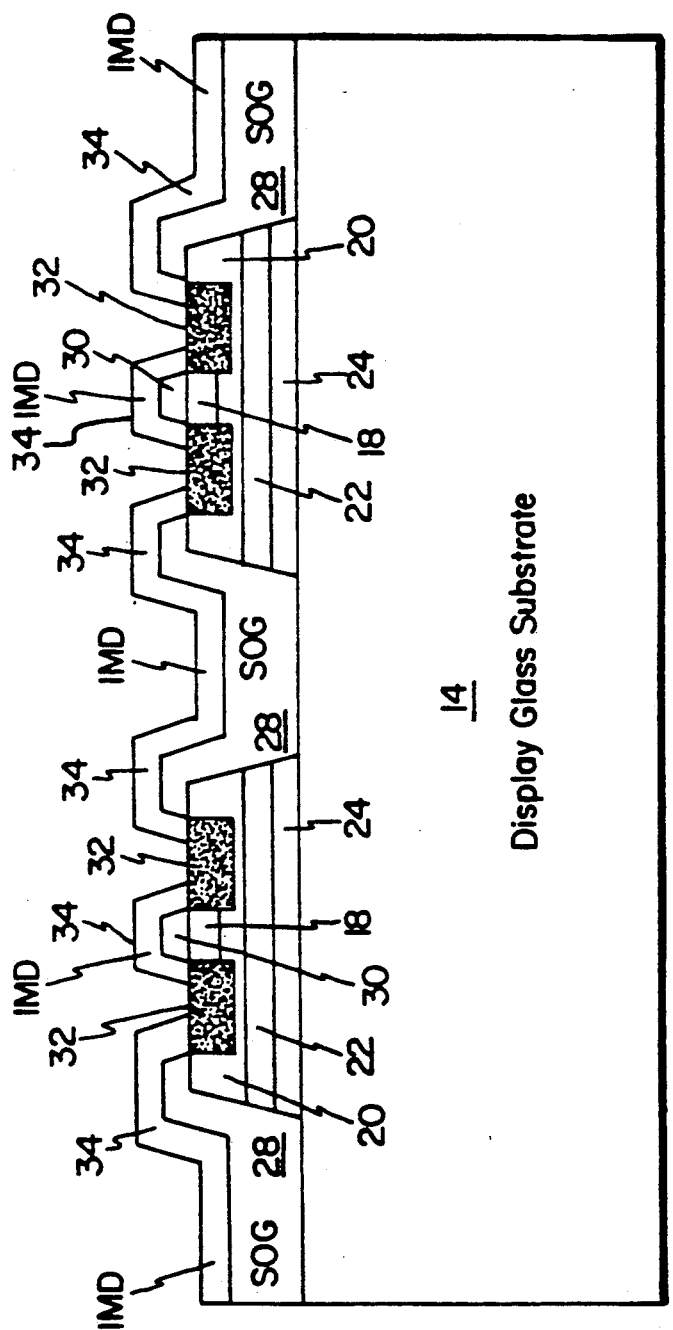
FIG. 10 shows the inner metal dielectric deposition, pattern and etch of contact vias.

Then a polysilicon gate 30 is deposited, patterned and etched as shown in FIG. 8. This is followed by self-aligned source-drain implantation 32 of phosphorus ($p^{31}$), and anneal as shown in FIG. 9. The implant 32 damage is annealed at 600° C. in a furnace for 20 hours. Implant 32 conditions are selected to achieve an implant 32 range greater than the thickness of gate oxide 18. Then a silicon dioxide intermetal dielectric 34 is deposited by plasma chemical vapor deposition, patterned and the contact vias are etched down to implants 32, as shown in FIG. 10.

Figure 11:
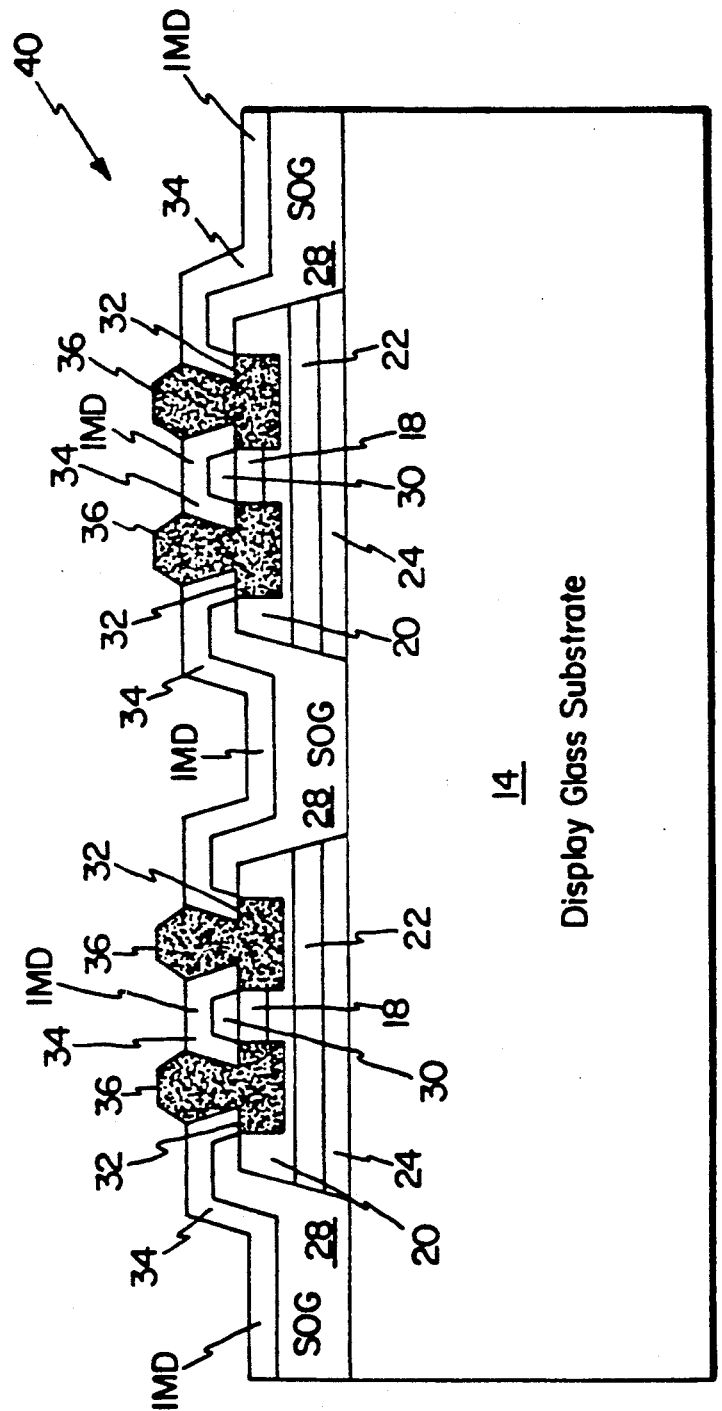
FIG. 11 indicates the source and drain metal deposition, pattern and etch.
Figure 12:
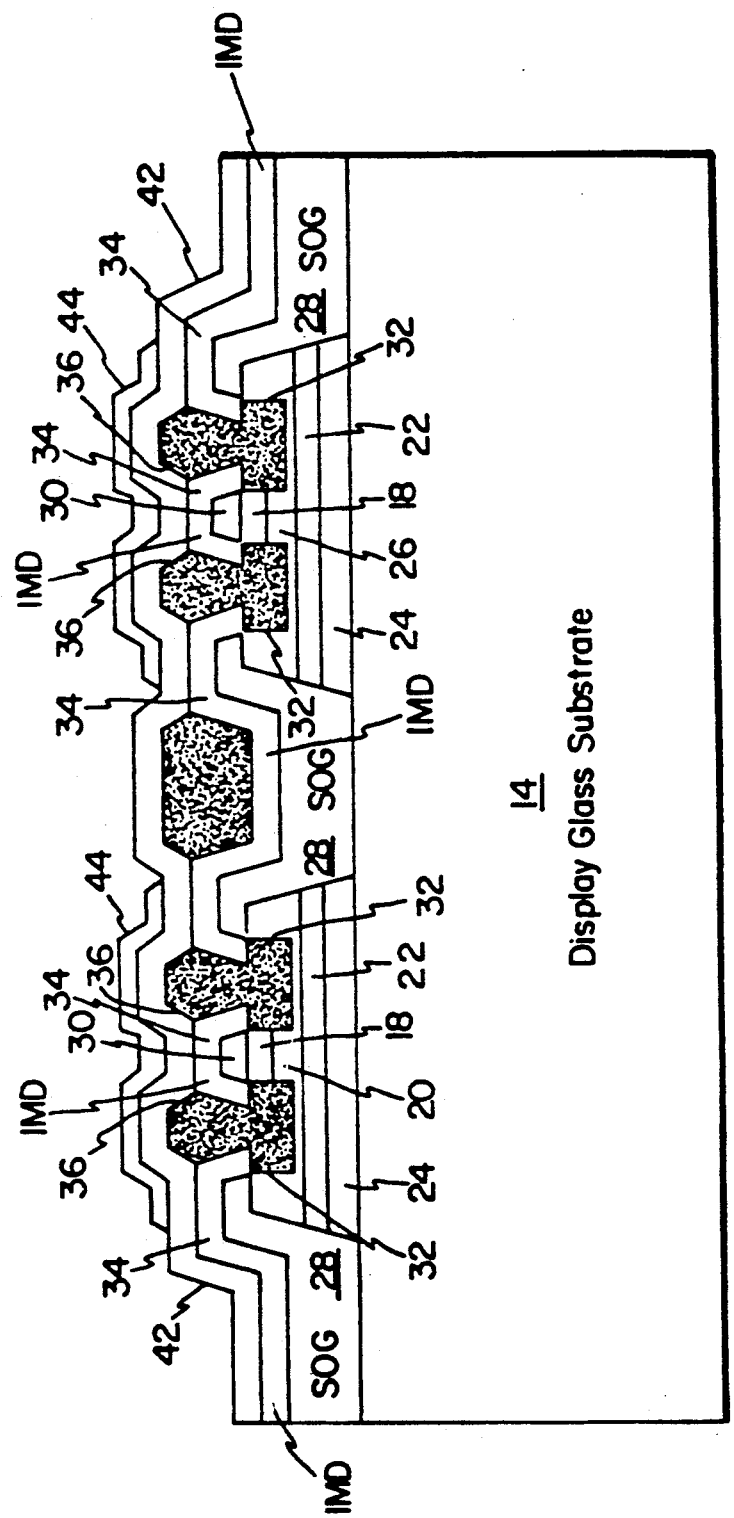
FIG. 12 reveals a passivation layer deposition, light shield layer deposition, pattern and etch.

Aluminum (+1% Silicon) is then deposited, patterned, and etched to define the source-drain metalization 36 as shown in FIG. 11. This completes the fabrication of TFT 40 for active matrix and integrated drivers. The next step is to fabricate a pixel electrode that electrically connects to the source electrode of the active matrix pixel TFT. For AMLCDs, an Indium Tin Oxide (ITO) layer, which is a transparent conductor, is deposited, patterned and etched to define the pixel electrode. For clarity, the pixel electrode is not shown in FIGS. 11 and 12. To maintain low leakage currents under high ambient lighting conditions, another light shield 44 is placed on the top of the TFT. First a silicon dioxide passivation dielectric layer 42 is deposited on top of source-drain metalization 36. Then a second aluminum layer is deposited, patterned, and etched to obtain top light shield 44 as shown in FIG. 12.

This active matrix substrate with high mobility TFT and integrated drivers is then utilized to fabricate high resolution AMLCDs using conventional liquid crystal display assembly techniques.

Note that the invention can also be used to fabricate integrated drivers only using the high mobility single crystal silicon TFTs, while using an a-Si or poly-Si TFT array for an active matrix. Further, the high mobility TFTs of this invention can be used to fabricate integrated drivers for TFEL and plasma display panels. Additionally, the high mobility TFTs of this invention can be used to fabricate active matrix TFEL displays with integrated drivers. In the case of an active matrix TFEL display, a reflective film such as aluminum is used as the pixel electrode. The source-drain aluminum (see FIG. 11) is used to fabricate the reflective electrode for the electroluminescent pixel.

The high mobility TFT process described above illustrates the procedures for fabricating n-channel TFTs. If p-channel TFTs are required, a similar process can be employed by changing the dopant in film 20 to phosphorus, and the source-drain implant 32 in FIG. 11 to Boron[11] ($B^{11}$). Also, complimentary metal oxide semiconductor (CMOS) devices, involving both n-, and p-channel TFTs on the same substrate, can be fabricated by masked implantation of the selected TFT locations (gate dielectric regions) with $p^{31}$ or $B^{11}$ after selective epitaxial deposition to create n- and p-regions, prior to electrostatic bonding. Display drivers using CMOS circuitry consume less power.

Figure 13:
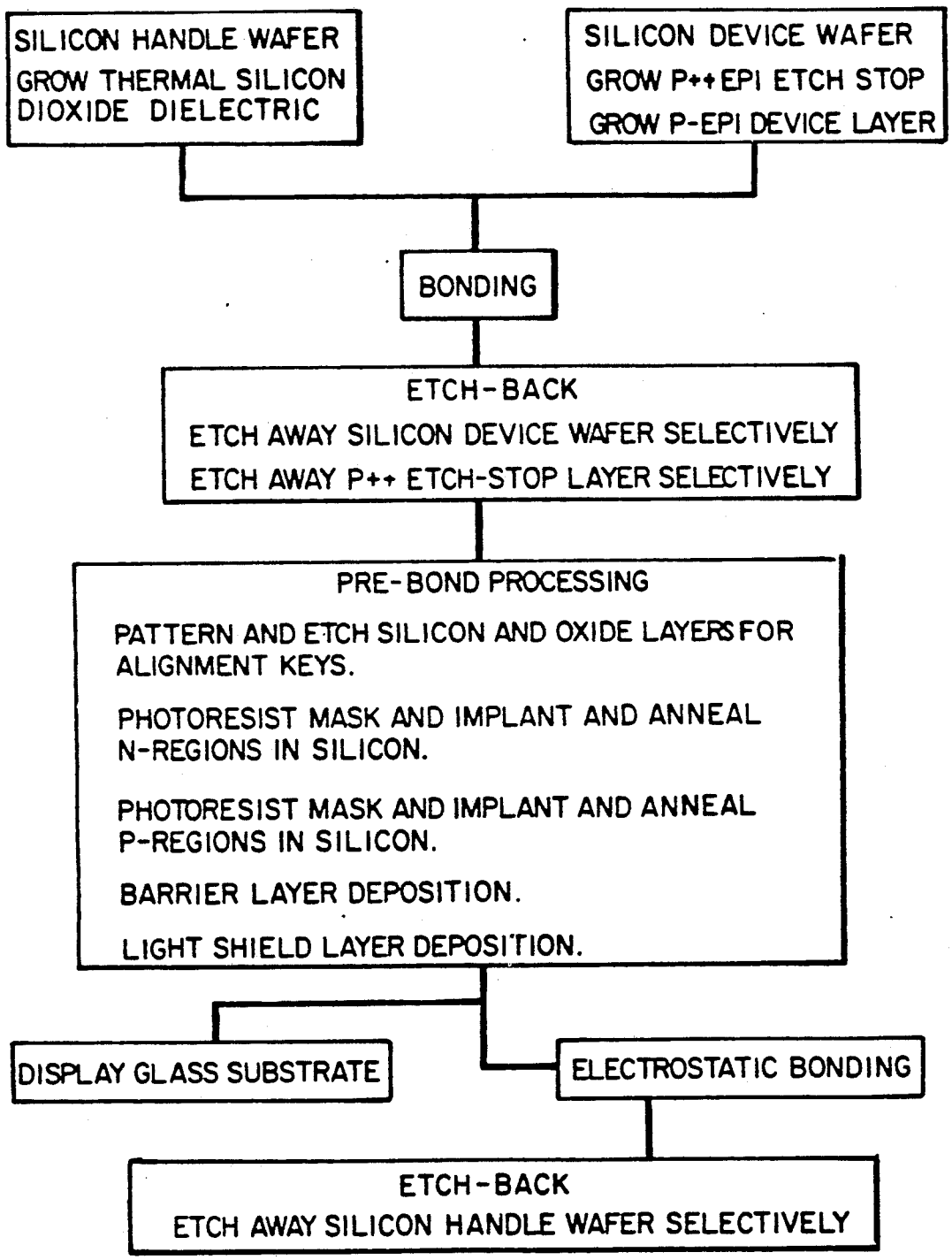
FIG. 13 reveals a alternate process sequence for the first part of the process for fabrication of high mobility TFTs.

FIG. 13 shows a flow diagram for an alternate processing scheme for fabricating high mobility single crystal silicon TFTs on a display glass substrate 46 using a high quality thermal silicon dioxide gate dielectric 48. This approach is shown in FIGS. 14-18.

Figure 14:
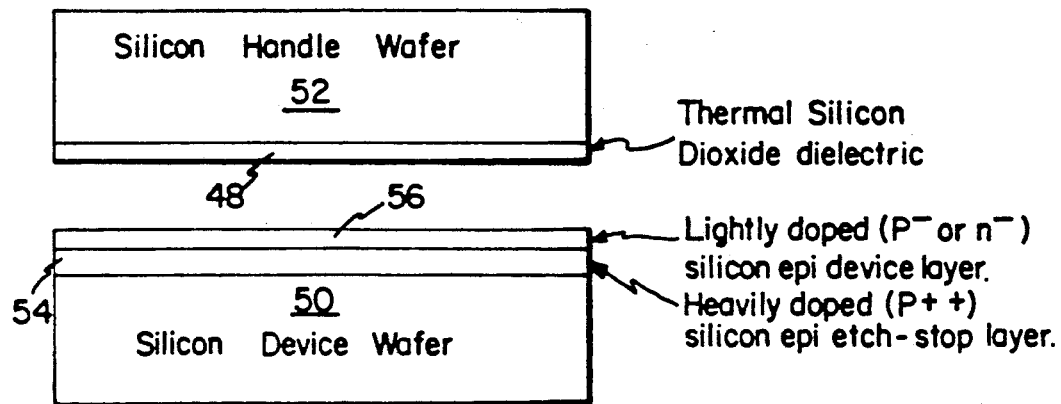
FIG. 14 shows a preprocessed silicon handle wafer and silicon device wafer prior to bonding.
Figure 15:
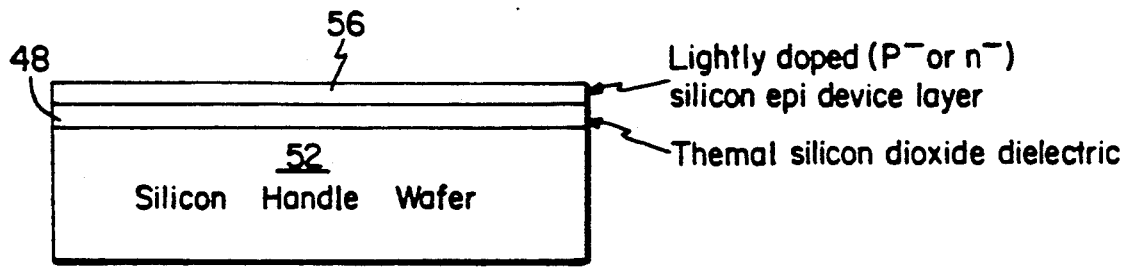
FIG. 15 shows a cross section of the silicon handle wafer, the thermal silicon dioxide dielectric and the silicon epitaxial device layer after the silicon device wafer and the $p^{++}$ etch-stop layer have been selectively etched away.

This process uses two single crystal silicon wafers, labelled as a silicon device wafer 50 and a silicon handle wafer 52, respectively. Both wafers 50 and 52 are of p-type with resistivity of about 1 ohm-cm, and (100) orientation. First, a high quality thermal silicon dioxide layer 48 of about a 5000 angstrom thickness is grown on wafer 52 using dry oxygen at a temperature of about 1000 degrees C. In parallel, a heavily boron doped p++ silicon etch-stop layer 54 with a thickness of about 2 microns, and a lightly doped (p− or n−) device layer 56 with a thickness of about 1 micron are grown on silicon device wafer 50, using silicon epitaxy. Then the two wafers, 50 and 52, are bonded to each other either by using electrostatic bonding or diffusion bonding. FIG. 14 shows a cross-section through silicon handle wafer 52 and silicon device wafer 50 prior to bonding. After bonding, silicon device wafer 50 is selectively etched away using selective chemical etch such as ethylene diamine pyrocatechol (EDP). FIG. 15 shows a cross-section through handle wafer 52 after the bonding and selective etching of device wafer 50.

Then, silicon handle wafer 52 is photolithographically patterned to etch alignment keys in silicon epi device layer 56 and thermal silicon dioxide gate dielectric 48. This allows masked implantation anneal of the n− and p− regions in device epi silicon film 56 prior to bonding to low temperature display glass substrate 46. (The alignment key fabrication and corresponding masked implantation processes are not shown.)

Figure 16:
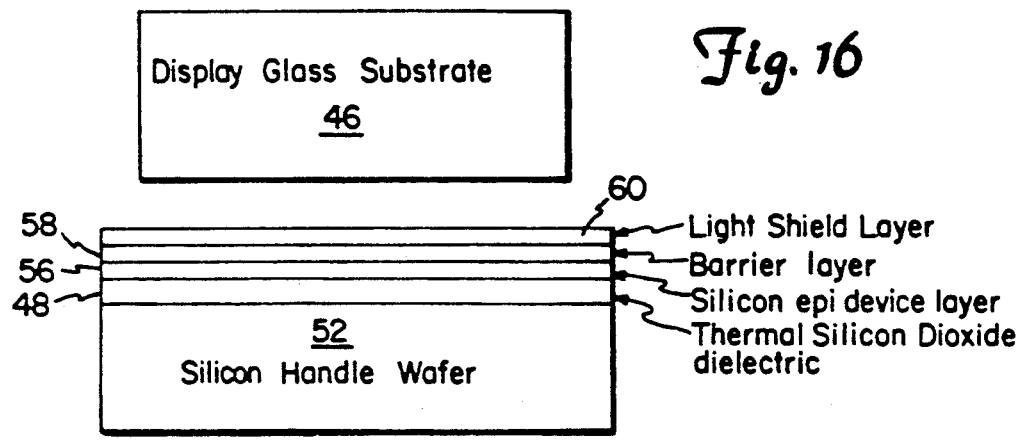
FIG. 16 shows the preprocessed silicon handle wafer prior to its electrostatic bonding to the display glass substrate.
Figure 17:
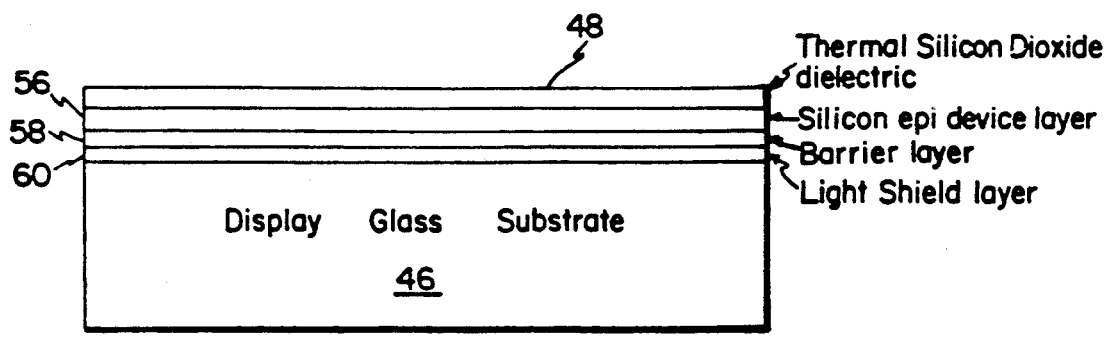
FIG. 17 shows a cross section of the display glass substrate after electrostatic bonding and selective etching of the silicon handle wafer.
Figure 18:
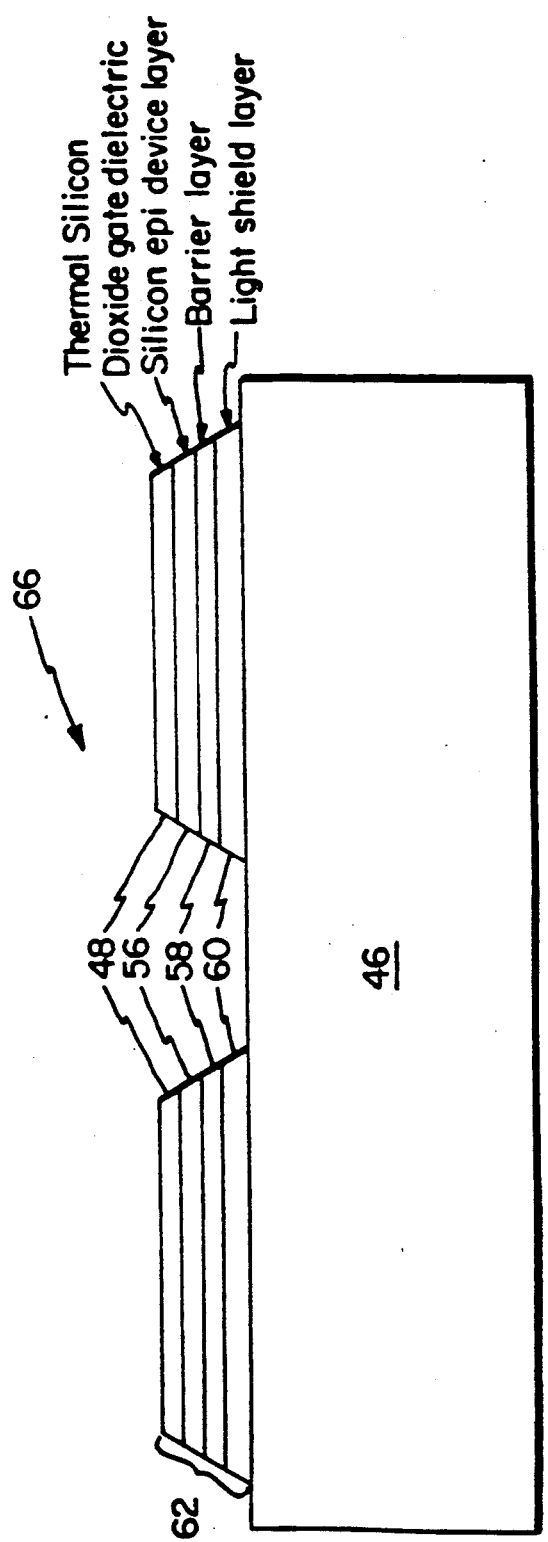
FIG. 18 is a cross-sectional view after the silicon islands along with the gate dielectric, have been etched.

Next, a barrier layer 58 (about a 2500 angstrom thick plasma deposited silicon nitrite or silicon dioxide), and light shield layer 60 of about 2000 angstroms thick are deposited on top of silicon epi device layer 56 as shown in FIG. 16. This preprocessed silicon handle wafer 52 is then electrostatically bonded to display glass substrate 46 at light shield layer 60. After bonding, silicon handle wafer 52 is selectively etched away using the EDP etch or potassium hydroxide (KOH) etch. Etch rate of these etches for the thermal silicon dioxide dielectric is insignificant compared to the etch rate for handle silicon wafer 52. FIG. 17 shows a cross-section through display glass substrate 46 and accompanying layers 48, 56, 58 and 60, after silicon handle wafer 52 is selectively etched away. Then, silicon islands 62 along with thermal silicon dioxide dielectric layer 48, are patterned for the regions requiring TFTs, and etched as shown in FIG. 18. From this point on, the substrate assembly in FIG. 18 is processed similar to the first approach starting from FIG. 5. The corresponding components of devices 64 and 66 are, respectively, glass substrates 14 and 46, light shield layers 24 and 60, barrier layers 22 and 58, silicon epitaxial layers 20 and 56, silicon dioxide dielectrics 18 and 48, and islands 26 and 62.

In summary, the invention permits fabrication of TFTs having single crystal silicon for high mobility integrated drivers for active matrix displays wherein high mobility means that in excess of 300 $Cm^2/V.S.$, thermal silicon dioxide gate dielectric for low (less than 1 volt) and stable threshold voltage, and light shield for low off-currents (less than 1 pico ampere) under high ambient lighting conditions are accomplished.

The present invention may utilize variations to the basic processes, illustrated above, such as by using different thicknesses for individual layers, processing temperatures, and other processing conditions.

What is claimed is:

1. A method for fabricating high mobility thin film transistors as integrated drivers on a substrate, comprising:

growing a silicon dioxide layer on a first silicon wafer;
   growing a doped silicon etch-stop layer on a second silicon wafer;
   growing a silicon epitaxy layer on the silicon etch-stop layer;
   bonding the first and second silicon wafers together at the silicon dioxide layer and the silicon epitaxy layer;
   etching away the second silicon wafer;
   etching away the silicon etch-stop layer;
   depositing a barrier layer on the silicon epitaxy layer;
   depositing a first light shield layer on the barrier layer;
   bonding a glass substrate to the first light shield layer of the first silicon wafer;
   etching away the first silicon wafer; and
   etching regions of the silicon dioxide layer, the silicon epitaxy layer, the barrier layer and the first light shield layer to form a plurability of islands, situated on the glass substrate.

2. Method of claim 4 further comprising:
   coating a glass layer on the plurability of islands and exposed portions of the glass substrate on the same side of the plurability of islands;

etching portions of the glass layer to expose a region of the silicon dioxide layer on each island of the plurability of islands;

depositing a polysilicon layer on each region of the silicon dioxide layer of each island;

etching a portion of the polysilicon layer and forming a polysilicon gate situated on the region of the silicon dioxide layer of each island;

implanting source and drain implantations into the barrier layer on each island at a thickness greater than the thickness of silicon dioxide layer;

annealing the source and drain implantations;

depositing a silicon dioxide intermetal dielectric layer on the plurability of the islands and on remaining portions of the layer of glass;

etching contact vias through the silicon dioxide intermetal dielectric layer to the source and drain implantations on each island; and depositing and etching source and drain metalizations to the source and drain implantations via the contact vias.

3. Method of claim 5 further comprising:

depositing a silicon passivation dielectric layer on the source and drain metalizations;

depositing a second light shield layer on the silicon passivation dielectric layer; and etching the second light shield layer but leaving a portion of the second light shield over each island.

* * * * *